(12) United States Patent
Schillinger et al.

(10) Patent No.: US 11,560,316 B2
(45) Date of Patent: Jan. 24, 2023

(54) PROCESS AND APPARATUS FOR REMOVAL OF IMPURITIES FROM CHLOROSILANES

(71) Applicant: NexWafe GmbH, Freiburg (DE)

(72) Inventors: Kai Schillinger, Freiburg (DE); Nena Milenkovic, Reute (DE)

(73) Assignee: NexWafe GmbH, Freiburg (DE)

( * ) Notice: Subject to any disclaimer, the term of this patent is extended or adjusted under 35 U.S.C. 154(b) by 325 days.

(21) Appl. No.: 16/758,156

(22) PCT Filed: Oct. 19, 2018

(86) PCT No.: PCT/EP2018/078782
§ 371 (c)(1),
(2) Date: Apr. 22, 2020

(87) PCT Pub. No.: WO2019/081380
PCT Pub. Date: May 2, 2019

(65) Prior Publication Data
US 2020/0283298 A1  Sep. 10, 2020

(30) Foreign Application Priority Data
Oct. 27, 2017  (DE) .......................... 102017125221.5

(51) Int. Cl.
*C01B 33/107* (2006.01)
*B01D 53/00* (2006.01)
(Continued)

(52) U.S. Cl.
CPC ...... *C01B 33/10778* (2013.01); *B01D 53/005* (2013.01); *C01B 33/03* (2013.01);
(Continued)

(58) Field of Classification Search
CPC ............ C01B 33/10778; C01B 33/107; C01B 33/1071; C01B 33/03; C01B 33/08; C23C 16/24; C23C 16/0227; C23C 16/4402
See application file for complete search history.

(56) References Cited

U.S. PATENT DOCUMENTS 4,092,446 A     5/1978   Padovani et al.
4,127,598 A * 11/1978   McEntee ................... C07F 7/20
                                                     556/454
(Continued)

FOREIGN PATENT DOCUMENTS

CN        101497442       8/2009
CN        102325722 A * 1/2012 ........... C01B 33/021
(Continued)

OTHER PUBLICATIONS

Vorotyntsev, V.M., et al., "Fine Purification of Silane for Removal of Chlorosilanes by Membrane Gas Separation". Petroleum Chemistry, 2013, vol. 53, No. 8, pp. 627-631.*
(Continued)

*Primary Examiner* — Bret P Chen
(74) *Attorney, Agent, or Firm* — Volpe Koenig

(57) ABSTRACT

A process for removal of impurities, in particular of dopants, from chlorosilanes which includes the following steps: (a) heating a deposition surface (3); (b) contacting the heated deposition surface (3) with at least one gaseous chlorosilane mixture, the gaseous chlorosilane mixture including at least one chlorosilane and at least one impurity, in particular at least one dopant; (c) at least partially removing the impurity, in particular the dopant, by forming polycrystalline silicon depositions on the deposition surface (3), the polycrystalline silicon depositions being enriched with the impurity, in particular with the dopant; (d) discharging the purified gaseous chlorosilane mixture; (e) contacting the heated deposition surface (3) with an etching gas to return the
(Continued)

polycrystalline silicon depositions and the impurity, in particular the dopant, into the gas phase to form a gaseous etching gas mixture; and (f) discharging the gaseous etching gas mixture.

9 Claims, 2 Drawing Sheets

(51) Int. Cl.
    *C01B 33/03*    (2006.01)
    *C23C 16/02*    (2006.01)
    *C23C 16/24*    (2006.01)
    *C23C 16/44*    (2006.01)
    *C23C 16/46*    (2006.01)

(52) U.S. Cl.
    CPC ...... *C01B 33/1071* (2013.01); *C23C 16/0227* (2013.01); *C23C 16/24* (2013.01); *C23C 16/4402* (2013.01); *C23C 16/46* (2013.01)

(56) References Cited

U.S. PATENT DOCUMENTS

| | | | | |
|---|---|---|---|---|
| 4,481,178 | A * | 11/1984 | Kray | C01B 33/10794 423/342 |
| 4,713,230 | A * | 12/1987 | Doornbos | C01B 33/10784 423/342 |
| 4,755,201 | A * | 7/1988 | Eschwey | B01D 8/00 62/55.5 |
| 4,800,189 | A * | 1/1989 | Eschwey | B01J 20/3236 502/320 |
| 5,094,830 | A * | 3/1992 | Tom | B01D 53/28 502/157 |
| 8,691,055 | B2 * | 4/2014 | Ghetti | C01B 33/10778 203/67 |
| 2009/0068081 | A1 * | 3/2009 | Uehara | C01B 33/10778 423/342 |
| 2011/0158857 | A1 | 6/2011 | Erk | |
| 2012/0121493 | A1 * | 5/2012 | Nagai | C01B 33/10778 423/325 |
| 2013/0121907 | A1 * | 5/2013 | Hazeltine | C01B 33/10778 423/342 |
| 2015/0175430 | A1 * | 6/2015 | Sakida | C01B 33/035 423/350 |
| 2017/0190585 | A1 * | 7/2017 | Miyao | B01D 3/14 |

FOREIGN PATENT DOCUMENTS

| | | | | |
|---|---|---|---|---|
| CN | 102372271 | | 3/2012 | |
| CN | 101487139 | | 5/2012 | |
| CN | 101400835 | | 7/2012 | |
| DE | 240729 | | 11/1986 | |
| DE | 10048504 | | 4/2002 | |
| EP | 0387638 | A2 * | 3/1990 | ........... C01B 33/107 |
| EP | 2634142 | A1 * | 9/2013 | ........... C01B 33/107 |
| EP | 2465819 | B1 * | 6/2016 | ........... C01B 33/107 |
| JP | 2006321675 | | 11/2006 | |
| KR | 10-1629061 | * | 6/2016 | ........... C01B 33/107 |
| WO | WO 2011/024257 | A1 * | 3/2011 | ........... C01B 33/107 |

OTHER PUBLICATIONS

Southwest Thermal Technology Inc. "Heat Exchanger: Materials & Construction Shell & Tube", Retrieved from internet: https://www.shell-tube.com/Materials-and-Construction.html, retrieved Jan. 16, 2019, Dec. 31, 2015.

* cited by examiner

PROCESS AND APPARATUS FOR REMOVAL OF IMPURITIES FROM CHLOROSILANES

BACKGROUND

Production of crystalline silicon layers for solar cells and microelectronics may be carried out inter alia by chemical gas phase epitaxy of silicon on substrates to achieve markedly lower layer thicknesses compared to conventional production processes comprising sawing of silicon blocks from the Czochralski or zone melting processes. Since in chemical gas phase epitaxy the thickness of the silicon layer formed may be controlled through suitable choice of the reaction conditions a subsequent sawing of the silicon, indispensable for silicon blocks from the aforementioned processes, is not required, thus avoiding sawing losses. The reduction in the layer thickness and sawing losses made possible by chemical gas phase epitaxy thus results in a marked reduction in production costs.

Suitable silicon precursor compound include inter alia silanes and chlorosilanes, the use of silanes generally being avoided due to their capacity for autoignition on contact with atmospheric oxygen. For thermodynamic reasons it is generally only a small proportion of the employed precursor compound that is deposited as a solid layer on a substrate in a chemical gas phase deposition. This proportion is dependent of a gas composition in the reaction chamber of the chemical gas phase deposition. In the production of crystalline silicon layers by gas phase epitaxy using chlorosilanes as the precursor compound, for example silicon tetrachloride or trichlorosilane, only around 25% of the chlorosilane is converted for example. Polluting and sometimes very difficult to purify waste products in the form of gaseous chlorosilane mixtures are therefore continuously generated. To reduce process costs and to reduce these polluting waste products it is therefore absolutely necessary, especially on a large industrial scale, for the unused chlorosilane to be purified and recycled into the process, However, a problem in such recycling of the chlorosilane is that the offgas discharged from large industrial scale plants contains not only unused chlorosilanes and hydrogen as process gas but also small amounts of unused dopants and impurities. Dopants are present in the gaseous chlorosilane mixtures in traces of just a few ppb (parts per billion) for example. Such low concentrations of dopants cannot be removed to a sufficient extent by conventional chlorosilane recycling, such as for example using a distillative separation apparatus with an upstream gas scrubber. Yet, since even small variations in the concentration of the dopants have a marked effect on the semiconductor properties of silicon, the concentration of the dopants in the chlorosilane must be adjusted with a precision of just a few ppm, and impurities removed, before the chlorosilane is supplied again to the actual epitaxy process. While such high-purity chlorosilanes are commercially available they are very costly to produce which ultimately adversely affects the process costs of chemical gas phase epitaxy. Relatively inexpensive chlorosilanes generally contain metal-containing impurities which likewise have a marked effect on the semiconductor properties of crystalline silicon layers.

Since a distillative purification of the chlorosilane mixtures is insufficient for the removal of such impurities, processes using microporous solid phase materials to remove the dopants have been proposed for example, said solid phase materials binding the dopants by way of physical interactions to remove them from a liquid or gaseous chlorosilane mixture. For example, U.S. Pat. No. 4,713,230 A proposes a process for removal of boron-containing dopants from chlorosilanes wherein a gaseous boron-containing chlorosilane mixture is passed over a silica gel. This process does allow a reduction in the boron concentration down to 100 ppba (parts per billion atomic). However, when using silica gel further waste products requiring corresponding disposal are generated. The amount of purified chlorosilane and the purification rate further depend strongly on the properties and the amount of the employed solid phase material with the result that such a solid phase material may be integrated on a large industrial scale into a circular process only with difficulty.

SUMMARY

The present invention accordingly has for its object to specify a process and an apparatus for removal of impurities, in particular of dopants, from chlorosilanes which is suitable for purification and for recycling of chlorosilanes on a large industrial scale.

This object is achieved by a process and an apparatus having one or more features disclosed herein.

Advantageous developments of the inventive concept may be found below and in the claims.

The invention relates to a process for removal of impurities, especially of dopants, from chlorosilanes. The invention further relates to an apparatus for removal of impurities, in particular of dopants, from chlorosilanes.

The process according to the invention for removal of impurities, in particular of dopants, from chlorosilanes has the following process steps:

A heating of a deposition surface is initially carried out in a process step (a). In a process step (b) at least one gaseous chlorosilane mixture is contacted with the heated deposition surface, said gaseous chlorosilane mixture comprising at least one chlorosilane and at least one impurity, in particular at least one dopant. This is followed in a process step (c) by an at least partial removal of the impurity, in particular of the dopant, by formation of polycrystalline silicon deposits on the deposition surface, said polycrystalline silicon deposits being enriched with the impurity, in particular with the dopant. In subsequent process step (d) the purified, gaseous chlorosilane mixture is discharged. For recycling of the polycrystalline silicon deposits and the impurity, in particular of the dopant, into the gas phase in a process step (e) an etching gas is contacted with the deposit surface to form a gaseous etching gas mixture. A discharging of the gaseous etching gas mixture is carried out in a further process step (f).

It is well known that when using chlorosilanes in chemical gas phase epitaxy under atmospheric pressure that polycrystalline silicon deposits already occur at temperatures above 600° C. These polycrystalline silicon deposits are unwanted byproducts in chemical gas phase epitaxy which can lead inter alia to blockage of gas conduits of the epitaxy chamber, as a result of which the epitaxy chamber and the accompanying gas conduits must regularly be freed of these polycrystalline silicon deposits.

Studies by the applicant have shown that impurities and dopants present in the chlorosilanes are enriched in the polycrystalline silicon deposits and can therefore be removed from the chlorosilane mixtures. The reason for this is that polycrystalline silicon deposits exhibit a multiplicity of crystal defects in which the impurities and dopants are incorporated/enriched. Furthermore, the decomposition temperatures of commonly used dopant compounds, in particular hydrides, in particular phosphine and diborane, are lower than those of chlorosilanes. Accordingly, even a very small amount of polycrystalline silicon formed can capture large proportions of the impurities and dopants. Using an etching gas the polycrystalline silicon deposits formed may be reconverted into the gas phase and discharged together with the impurities and/or the dopants. The process according to the invention thus allows for removal of impurities from chlorosilane mixtures without the use of further purification materials.

In an advantageous embodiment of the process the contacting of the gaseous chlorosilane mixture and the deposition surface in step (b) is carried out in the presence of a process gas. It is within the scope of the invention here that a total amount of the gaseous chlorosilane mixture is present in the process gas in an amount of substance ratio of 1 to 10 mol %. However the invention is not limited thereto.

Since the deposition rate of polycrystalline silicon is temperature-dependent and may be elevated in the presence of hydrogen, hydrogen is employed as the process gas in a further advantageous embodiment of the process according to the invention.

In an advantageous embodiment of the process the purified, gaseous chlorosilane mixture discharged in step (d) has a residual concentration of the impurity, in particular of the dopant, of less than 1000 ppb, preferably less than 100 ppb, particularly preferably less than 15 ppb. Chlorosilanes having such a low concentration of impurities and/or dopants are suitable for recycling into a corresponding epitaxy process.

In a further advantageous embodiment the chlorosilane is tetrachlorosilane and/or trichlorosilane and/or dichlorosilane. However, it is also within the scope of the invention that chlorosilanes of high molecular weight may be used.

A further advantageous embodiment of the process provides that the formation of polycrystalline silicon deposits on the deposition surface is carried out at a pressure of 0.8 bar to 1.2 bar. It is therefore within the scope of the invention that the process according to the invention is performed at substantially atmospheric pressure. This avoids time-intensive evacuation of the deposition surface, thus markedly reducing the duration of the purification of the chlorosilane mixture.

Since the deposition of polycrystalline silicon takes place only at temperatures above 600° C., in a further advantageous embodiment of the process according to the invention in step (a) the deposition surface is heated to a temperature of 600° C. to 1000° C., preferably of 700° C. to 900° C., particularly preferably of 750° C. to 850° C. The heating of the deposition surface to a certain temperature accordingly allows the deposition rate of polycrystalline silicon on the deposition surface, and thus a removal of the impurities, to be specifically adjusted.

In a further advantageous embodiment of the process according to the invention the etching gas is hydrogen chloride. A contacting of the deposition surface with a hydrogen chloride causes the polycrystalline silicon deposits formed thereupon to be converted into the gas phase to form an etching gas mixture.

A further aspect of the present invention is an apparatus for removal of impurities from chlorosilanes, in particular for performing a process as claimed in any of claims 1 to 8, comprising: a deposition chamber, said deposition chamber comprising a deposition surface for deposition of polycrystalline silicon, at least one gas inlet and at least one gas outlet, at least one fluid feed conduit, preferably gas feed conduit, said fluid feed conduit being connected to the gas inlet of the deposition chamber, and at least one fluid discharge conduit, preferably gas discharge conduit, said fluid discharge conduit being connected to the gas outlet of the deposition chamber.

In a first advantageous embodiment of the invention the deposition chamber comprises a heating apparatus, said heating apparatus serving to heat the deposition surface and/or the fluid feed conduit and/or the fluid discharge conduit. This heating apparatus may be in the form of for example electrically operated coils which at least partially surround the deposition chamber and/or the fluid feed conduit and/or the fluid discharge conduit. However, the invention is not limited thereto.

In a second advantageous embodiment of the invention the heating apparatus serves to heat the deposition surface to 600° C. to 1000° C., preferably to 700° C. to 900° C., particularly preferably to 750° C. to 850° C., for deposition of polycrystalline silicon on the deposition surface.

It is within the scope of the invention in this case that this heating apparatus may be used to form a plurality of heating zones to optimize the formation of polycrystalline deposits. This advantageously has the result that only a small proportion of the chlorosilane is deposited as polycrystalline silicon at the deposition surface, so that the majority of the chlorosilane may therefore be discharged in the purified, gaseous chlorosilane mixture. However, at the same time a large proportion of the impurities may be enriched in the small amount of deposited polycrystalline silicon. This advantageously results in purification of the gaseous chlorosilane mixture at simultaneously low consumption of the silicon precursor compound. For example there may be a first heating zone in the region of the gas feed conduits and/or the gas inlets to heat the gaseous chlorosilane mixture before it is contacted with the deposition surface. The formation of a plurality of heating zones moreover has a positive effect on the flow behavior of the gaseous chlorosilane mixture and/or of the process gas in the deposition chamber.

In a second advantageous embodiment of the apparatus according to the invention the deposition chamber is a hollow body having an outer wall, said outer wall surrounding an inner region of the deposition chamber, said inner region having arranged in it at least one dividing wall for directing a gas flow.

In a further advantageous embodiment of the apparatus according to the invention the deposition surface is at least partially arranged on the side of the outer wall of the deposition chamber facing the inner region and/or at least partially arranged on the dividing wall. The dividing wall therefore serves not only to direct the gas flow but also to enlarge the deposition surface by allowing polycrystalline silicon to be formed not only on the side of the outer wall facing the inner region but also on the surface of the dividing wall. The amount of deposited polycrystalline silicon on the deposition surface is accordingly increased.

To further increase the amount of polycrystalline silicon deposits and to increase the distance travelled by the gas flow through the deposition chamber, in a further advantageous embodiment of the apparatus according to the invention the inner region of the deposition chamber comprises a multiplicity of dividing walls, said dividing walls dividing the inner region in such a way that a gas introduced into the deposition chamber is directed through the deposition chamber in a meandering path, the dividing walls preferably being arranged substantially perpendicularly to the longitudinal axis of the deposition chamber.

In a further preferred embodiment of the apparatus according to the invention the gas inlet and the gas outlet are arranged on two substantially opposite sides of the outer wall of the deposition chamber. This ensures that the gas flow travels the maximum possible distance through the deposition chamber, thus further increasing the amount of polycrystalline silicon depositions.

To further enlarge the deposition surface and thus enhance takeup of the impurity, in particular of the dopant, the deposition surface is at least partially structured in a further advantageous embodiment of the apparatus according to the invention.

In a further preferred embodiment of the apparatus according to the invention the deposition surface comprises lamellae and/or channels to enlarge the surface area.

In a further advantageous embodiment of the apparatus according to the invention the deposition surface is formed from graphite or silicon carbide.

BRIEF DESCRIPTION OF THE DRAWINGS

Further advantageous properties of the invention are apparent from the following description of working examples with reference to the drawing. In the figures.

DETAILED DESCRIPTION

Figure 1:
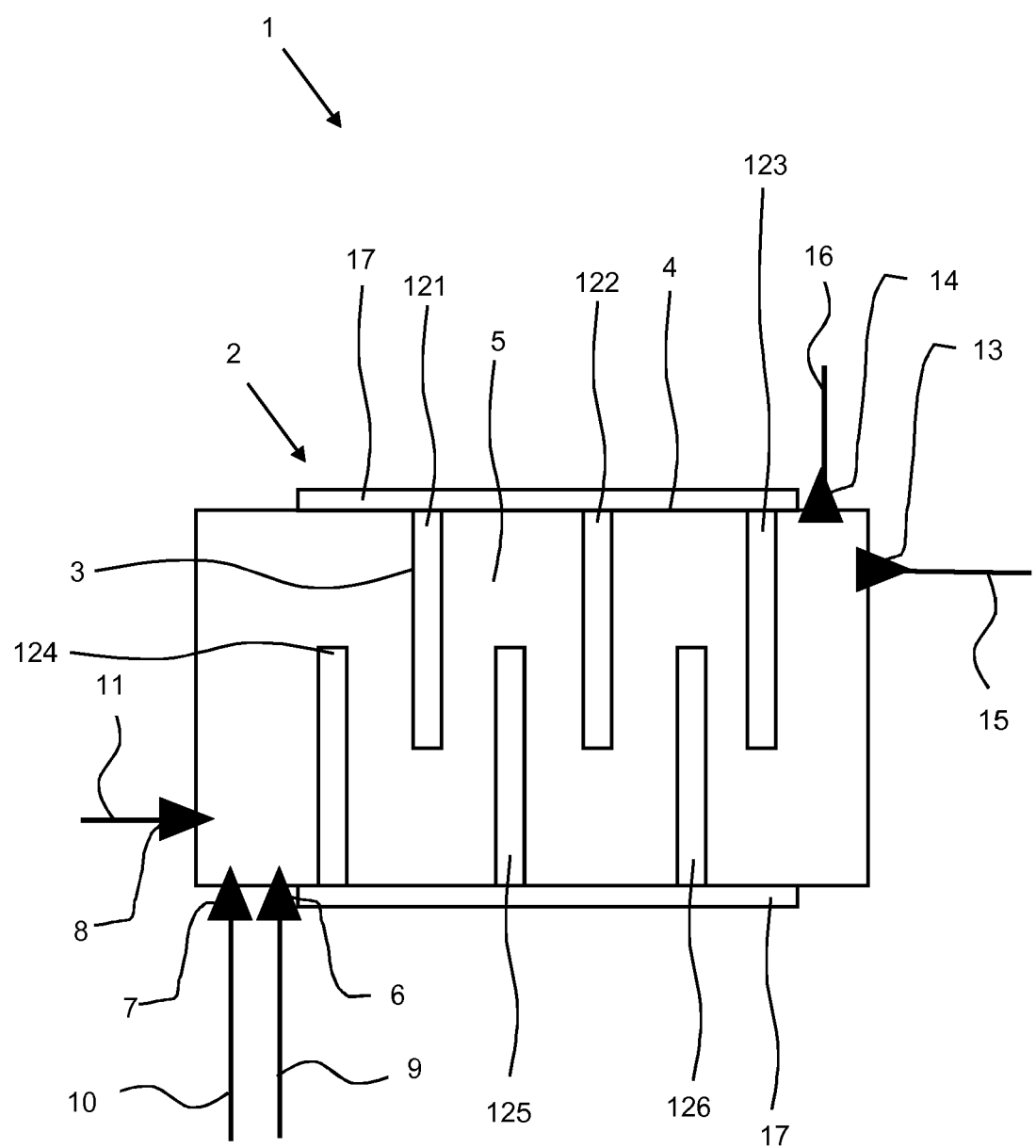
FIG. 1 shows a schematic representation of a first working example of an inventive apparatus for removal of impurities from chlorosilanes.

FIG. 1 shows a first working example of an inventive apparatus 1 for removal of impurities from chlorosilanes. This apparatus 1 comprises a deposition chamber 2 and a deposition surface 3. In the present working example the deposition surface 2 is formed from graphite.

The deposition chamber 2 is in the form of a hollow body having an outer wall 4, said outer wall surrounding an inner region 5 of the deposition chamber 2. The deposition chamber 2 further comprises three gas inlets 6, 7, 8 connected to the gas feed conduits 9, 10, 11. Via the gas inlets 6, 7, 8 a gaseous chlorosilane mixture, a process gas and an etching gas may be introduced into the deposition chamber 2 in temporal and/or spatial separation from one another. In the present working example the deposition chamber 2 and the deposition surface 3 have a temperature of 700° C. If the chlorosilane mixture is a liquid at room temperature an optional evaporator (not shown) may be arranged at the gas feed conduit 9.

Furthermore, six dividing walls 121, 122, 123, 124, 125, 126 for directing a gas flow are arranged in the inner region 5 of the deposition chamber 2. These dividing walls 121, 122, 123, 124, 125, 126 divide the inner region 5 of the deposition chamber 2 in such a way that a gas introduced into the deposition chamber 2 is directed through the deposition chamber 2 in a meandering path. As is apparent from FIG. 1 in the present working example the dividing walls 121, 122, 123, 124, 125, 126 are arranged perpendicularly to the longitudinal axis of the deposition chamber 2. However, the invention is not limited to such an arrangement of the dividing walls 121, 122, 123, 124, 125, 126.

To discharge the purified, gaseous chlorosilane mixture and the gaseous etching gas mixture two the gas outlets 13, 14 are arranged on the outer wall 4 of the deposition chamber 2, said gas outlets 13, 14 each being connected to a gas discharge conduit 15, 16. The gas outlets 13, 14 are arranged on the deposition chamber 2 such that they are opposite to the three gas inlets 6, 7, 8. This ensures that the gas flow travels the maximum possible distance through the deposition chamber, thus maximizing the depletion of impurities and/or dopants.

The sequence of a working example for the inventive process may be described with reference to FIG. 1 as follows: For removal of impurities and/or dopants from chlorosilanes the deposition surface 3 of the deposition chamber 2 is in the present working example heated to a temperature of 700° C. under atmospheric pressure. However, according to the composition of the gaseous chlorosilane mixture the deposition surface 3 may be heated to a different temperature in the range from 600° C. to 1000° C.

Subsequently a gaseous chlorosilane mixture which in the present working example contains a phosphorus-containing dopant and trichlorosilane is introduced via the gas feed conduit 9 into the inner region 5 of the deposition chamber 2 using the gas inlet 6. Simultaneously a process gas is introduced into the deposition chamber 2 via the gas inlet 8 connected to the gas feed conduit 11. However, it is also within the scope of the invention that the gaseous chlorosilane mixture and the process gas are introduced into the reaction chamber consecutively.

In the present working example the chlorosilane mixture and the process gas are introduced into the inner region 5 of the deposition chamber 2 in such a way that the chlorosilane mixture is present in the process gas in an amount of substance ratio of 3 mol %. High-purity hydrogen is supplied to the deposition chamber 2 as process gas.

Due to the temperature of 700° C. polycrystalline silicon deposits are formed on the deposition surface 3 of the deposition chamber 2, said polycrystalline silicon deposits being enriched with the phosphorus-containing dopant. The amount of chlorosilane used is adjusted via the selected temperature and gas composition. The chlorosilane which is used here is no longer available as productive gas. By virtue of completely traversing the deposition chamber 2, the dopant-containing chlorosilane mixture is virtually completely freed of the dopant. The size of the active surface affects the purification efficiency of the inventive apparatus. The purified, gaseous chlorosilane mixture is subsequently discharged from the deposition chamber 2 via the gas discharge conduit 15 using the gas outlet 13. In the present working example the discharged purified, gaseous chlorosilane mixture has a residual dopant concentration of 15 ppb. Once the purified, gaseous chlorosilane mixture has been discharged from the deposition chamber 2 an etching gas is supplied to the deposition chamber via the gas inlet 7 connected to the gas feed conduit 10. In the present working example hydrogen chloride is used as etching gas. The hydrogen chloride supplied to the deposition chamber 2 serves to return the polycrystalline silicon deposits and the dopant into the gas phase to form a gaseous etching gas mixture. This gaseous etching gas mixture is discharged from the deposition chamber 2 via the gas outlet 14 connected to the gas discharge conduit 16. The described process thus makes it possible alternately to purify a chlorosilane mixture contaminated with dopant and to remove the thus formed polycrystalline silicon deposits from the deposition chamber 2.

As is also apparent from FIG. 1 the deposition chamber 2 comprises a heating apparatus 17. This apparatus serves to heat the deposition surface 3 to a temperature in the range from 600° C. to 1000° C., thus allowing deposition of polycrystalline silicon. In the present case this heating apparatus 17 is in the form of electrically operated coils. In the present working example the deposition chamber 2 is virtually entirely surrounded by electrically operated coils (35 watt) which heat the deposition surface 3 to 700° C. However, the invention is not limited thereto. Other types of heating apparatuses may also be employed.

Figure 2:
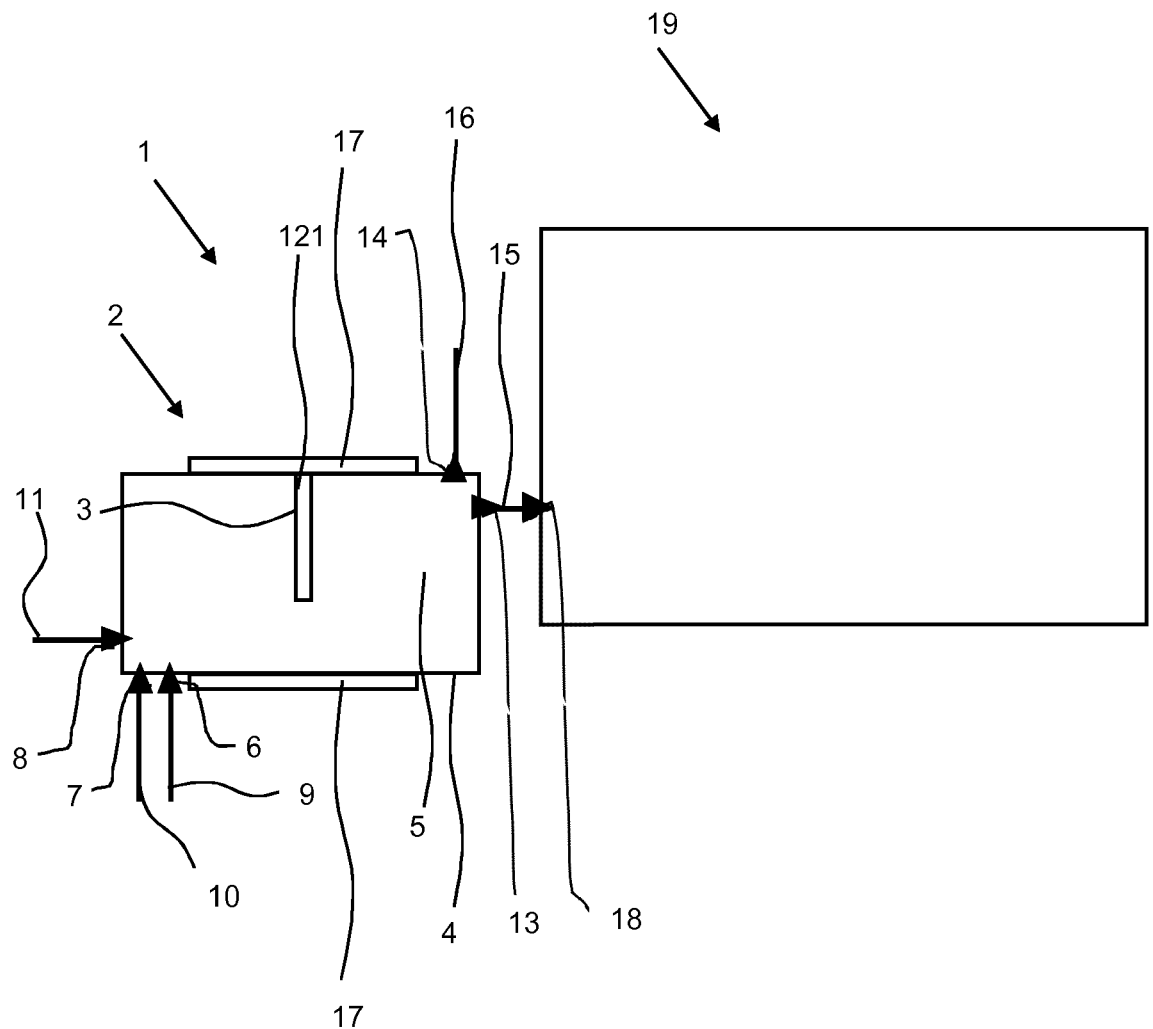
FIG. 2 shows a schematic representation of a second working example of an inventive apparatus for removal of impurities from chlorosilanes.

FIG. 2 shows a second working example of an inventive apparatus 1 for removal of impurities from chlorosilanes. The apparatus 1 comprises a set up largely identical to the configuration described in FIG. 1 and there is therefore initially no need to elaborate on further details. The deposition chamber shown in FIG. 2 comprises only one dividing wall 121 but may be expanded as required to include further dividing walls.

As shown in FIG. 2, the deposition chamber 2 may be connected via the gas discharge conduit 15 to a gas inlet 18 of an apparatus 19 for chemical gas phase epitaxy arranged downstream of the deposition chamber 2. Such a setup makes it possible for the gaseous chlorosilane mixture purified in deposition chamber 2 to be supplied to a downstream apparatus 19 for chemical gas phase epitaxy and used to form crystalline silicon layers. However, the invention is not limited to such an application.

The invention claimed is:

1. A process for removal of at least one impurity from chlorosilanes, the process comprising the steps of:
    (a) heating a deposition surface (3);
    (b) contacting at least one gaseous chlorosilane mixture with the heated deposition surface (3), said gaseous chlorosilane mixture comprising at least one chlorosilane and at least one impurity;
    (c) at least partially of the at least one impurity by formation of polycrystalline silicon deposits on the deposition surface (3), said polycrystalline silicon deposits being enriched with the impurity;
    (d) discharging the purified, gaseous chlorosilane mixture;
    (e) contacting an etching gas with the heated deposition surface (3) to return the polycrystalline silicon deposits and the at least one impurity into the gas phase to form a gaseous etching gas mixture; and
    (f) discharging the gaseous etching gas mixture.

2. The process as claimed in claim 1, further comprising in step (b) carrying out the contacting of the gaseous chlorosilane mixture and the deposition surface (3) in the presence of a process gas.

3. The process as claimed in claim 2, wherein the process gas is hydrogen.

4. The process as claimed in claim 1, wherein the purified, gaseous chlorosilane mixture discharged in step (d) has a residual concentration of the impurity of less than 1000 ppb.

5. The process as claimed in claim 1, wherein the chlorosilane comprises at least one of silicon tetrachloride, trichlorosilane, or dichlorosilane.

6. The process as claimed in claim 1, further comprising carrying out the formation of polycrystalline silicon deposits at the deposition surface (3) at a pressure of 0.8 to 1.2 bar.

7. The process as claimed in claim 1, further comprising in step (a) heating the deposition surface (3) to a temperature of 600° C. to 1000° C.

8. The process as claimed in claim 1, wherein the etching gas is hydrogen chloride.

9. The process of claim 1, wherein the at least one impurity is a dopant.

* * * * *